United States Patent

Ngo et al.

[11] Patent Number: 5,989,957
[45] Date of Patent: Nov. 23, 1999

[54] PROCESS FOR FABRICATING SEMICONDUCTOR MEMORY DEVICE WITH HIGH DATA RETENTION INCLUDING SILICON OXYNITRIDE ETCH STOP LAYER FORMED AT HIGH TEMPERATURE WITH LOW HYDROGEN ION CONCENTRATION

[75] Inventors: Minh Van Ngo, Union City; Sunil Mehta; David K. Foote, both of San Jose, all of Calif.

[73] Assignee: Advanced Micro Devices, Sunnyvale, Calif.

[21] Appl. No.: 08/859,761

[22] Filed: May 21, 1997

[51] Int. Cl.$^6$ .................. H01L 21/8247; H01L 21/4763
[52] U.S. Cl. .................. 438/257; 438/9.7; 438/637; 438/786
[58] Field of Search .................. 428/259–267, 428/970, 634, 786, 763

[56] References Cited

U.S. PATENT DOCUMENTS 4,363,868 12/1982 Takasaki et al. .
4,992,306 2/1991 Hochberg et al. .................. 427/255.3
5,010,039 4/1991 Ku et al. .
5,619,072 4/1997 Mehta .................. 257/774
5,747,369 5/1998 Kantimahanti et al. .................. 438/241
5,814,551 9/1998 Park et al. .................. 438/448

*Primary Examiner*—Richard Booth
*Attorney, Agent, or Firm*—David C. Alexander; Arter & Hadden LLP

[57] ABSTRACT

A semiconductor memory device such as a flash Electrically Erasable Programmable Read-Only Memory (Flash EEPROM) includes a floating gate with high data retention. A tungsten damascene local interconnect structure includes a silicon oxynitride etch stop layer which is formed using Plasma Enhanced Chemical Vapor Deposition (PECVD) at a temperature of at least 480° C. such that the etch stop layer has a very low concentration of hydrogen ions. The minimization of hydrogen ions, which constitute mobile positive charge carriers, in the etch stop layer, minimizes recombination of the hydrogen ions with electrons on the floating gate, and thereby maximizes data retention of the device.

20 Claims, 4 Drawing Sheets

PROCESS FOR FABRICATING
SEMICONDUCTOR MEMORY DEVICE
WITH HIGH DATA RETENTION
INCLUDING SILICON OXYNITRIDE ETCH
STOP LAYER FORMED AT HIGH
TEMPERATURE WITH LOW HYDROGEN
ION CONCENTRATION

BACKGROUND OF THE INVENTION

1. Field of the Invention

The present invention generally relates to the art of microelectronic integrated circuits, and more specifically to a process for fabricating a semiconductor memory device with high data retention including a silicon oxynitride etch stop layer formed at high temperature with a low hydrogen ion concentration.

2. Description of the Related Art

A flash or block erase Electrically Erasable Programmable Read-Only Memory (Flash EEPROM) semiconductor memory includes an array of cells which can be independently programmed and read. The size of each cell and thereby the memory are made small by omitting select transistors which would enable the cells to be erased independently. All of the cells are erased together as a block.

A memory of this type includes individual Metal-Oxide-Semiconductor (MOS) memory cells, each of which includes a source, drain, floating gate and control gate to which various voltages are applied to program the cell with a binary 1 or 0, or erase all of the cells as a block.

Tungsten damascene is a process for fabricating local interconnects which can be advantageously applied to semiconductor devices including flash EEPROMs. The process includes forming an insulator layer of, for example, tetraethylorthosilicate (TEOS) glass over the memory cells, and using Reactive Ion Etching (RIE) to form vertical interconnect holes through the glass down to interconnect areas (source, drain, etc.) of the cells. The holes are filled with tungsten which ohmically contacts the interconnect areas to form the local interconnects.

The TEOS etch is conventionally performed using octafluorobutene ($C_4F_8$) etchant, which also has a high etch rate for silicon. For this reason, a mechanism must be provided for performing the TEOS etch without allowing the etchant to act on the silicon of the underlying interconnect areas.

Such a mechanism includes forming a silicon oxynitride etch stop layer underneath the TEOS layer, and performing the etch in two stages. The first stage is the octafluorobutene etch through the TEOS layer, which terminates at the etch stop layer since octafluorobutene has a low etch rate for silicon oxynitride.

Then, a second RIE etch is performed using fluoromethane ($CH_3F$), which forms holes through the portions of the etch stop layer that are exposed through the holes in the TEOS layer, down to the interconnect areas of the devices. This is possible because fluoromethane has a high etch rate for silicon oxynitride, but a low etch rate for TEOS.

The structure can be further facilitated by using a silicide technique to increase the conductivity of the interconnect areas of the cells. Siliciding is a fabrication technique that enables electrical interconnections to be made that have reduced resistance and capacitance.

The silicide process comprises forming a layer of a refractory metal silicide material such as tungsten, titanium, tantalum, molybdenum, etc. on a silicon interconnect area (source or drain diffusion region) or on a polysilicon gate to which ohmic contact is to be made, and then reacting the silicide material with the underlaying silicon material to form a silicide surface layer having much lower resistance than heavily doped silicon or polysilicon. A silicide surface layer formed on a polysilicon gate is called "polycide", whereas a silicide surface layer formed on silicon using a self-aligned process is called "salicide".

A problem which has remained unsolved in the fabrication of flash EEPROM memories and other semiconductor device structures is data retention. A flash EEPROM cell is programmed by creating a negative charge (electrons) on the floating gate. The charge should remain until it is deliberately removed by erasing the cell.

However, the charge on a conventional flash EEPROM cell which is fabricated using a silicon oxynitride etch stop layer that is conventionally formed at a temperature of approximately 350° C. has been found to decrease substantially with time. This problem has remained unsolved in the art.

SUMMARY OF THE INVENTION

The present invention overcomes the drawbacks of the prior art by overcoming the problem of unsatisfactory data retention in semiconductor devices such as flash EEPROMs which include silicon oxynitride etch stop layers.

In accordance with the present invention, a semiconductor memory device such as a flash Electrically Erasable Programmable Read-Only Memory (Flash EEPROM) includes a floating gate with high data retention.

A tungsten damascene local interconnect structure includes a silicon oxynitride etch stop layer which is formed using Plasma Enhanced Chemical Vapor Deposition (PECVD) at a temperature of at least 480° C. such that the etch stop layer has a very low concentration of hydrogen ions.

The minimization of hydrogen ions, which constitute mobile positive charge carriers, in the etch stop layer, minimizes recombination of the hydrogen ions with electrons on the floating gate, and thereby maximizes data retention of the device.

These and other features and advantages of the present invention will be apparent to those skilled in the art from the following detailed description, taken together with the accompanying drawings, in which like reference numerals refer to like parts.

DETAILED DESCRIPTION OF THE INVENTION

The present inventors have discovered that a major cause of poor data retention in semiconductor devices such as flash EEPROMs as presented above is a high concentration of hydrogen ions in the silicon oxynitride etch stop layers of the devices. These hydrogen ions are highly mobile positive charge carriers which migrate to the floating gates of memory cells to recombine with electrons thereon and dissipate the charges on the floating gates.

The present invention overcomes these problems, and provides a semiconductor structure including a silicon oxynitride layer having a low concentration of hydrogen ions. Although the present invention is especially suited to a memory device including a floating gate in which data retention is a problem, the present invention is not so limited, and can be advantageously applied to a large variety of semiconductor devices which may or may not include floating gates or other charge retention elements. For example, the invention may be applied to semiconductor structures which include silicon oxynitride encapsulation layers.

FIGS. 1 to 10 are simplified sectional diagrams illustrating a process for fabricating a portion of a flash EEPROM semiconductor memory device according to the present invention. The detailed configuration of the device is not the particular subject matter of the invention, and only those elements which are necessary for understanding the invention will be described and illustrated.

Figure 1:
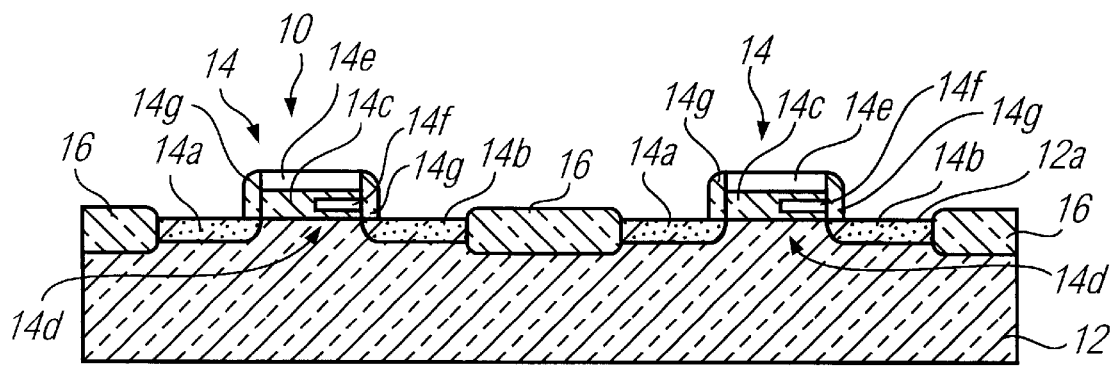
FIGS. 1 to 10 are simplified sectional views illustrating steps of a process for fabricating a semiconductor device according to the present invention.

As viewed in FIG. 1, a flash EEPROM memory 10 includes a silicon semiconductor substrate 12. Two erasable memory cells 14 are formed on a surface 12a of the substrate 12, each including a MOS transistor structure having a source 14a, drain 14b, gate oxide layer 14c, and channel 14d underlying the gate oxide layer 14c. The cells 14 are physically and electrically isolated from each other by field oxide regions 16.

A polysilicon control gate 14e is formed over each gate oxide layer 14c, and a polysilicon floating gate 14f is formed underneath the control gate 14e in the gate oxide layer 14c.

Although the gate oxide layers 14c are shown as being integral, they may comprise two or more sublayers. For example, portions of the gate oxide layers 14c which underlie the floating gates 14f may be separate tunnel oxide layers. Further shown in the drawing are electrically insulating gate sidewall spacers 14g.

The construction and operation of the memory 10 are not the particular subject matter of the invention and will not be described in detail. Furthermore, the reference numerals designating the individual elements of the memory cells will be omitted in FIGS. 2 to 10 except as required for understanding the invention to avoid cluttering of the drawings.

FIG. 1 illustrates the initial steps of the present process, which consist of providing the substrate 12, and forming semiconductor devices such as the erasable memory cells 14 on the surface 12a of the substrate 12.

Figure 2:
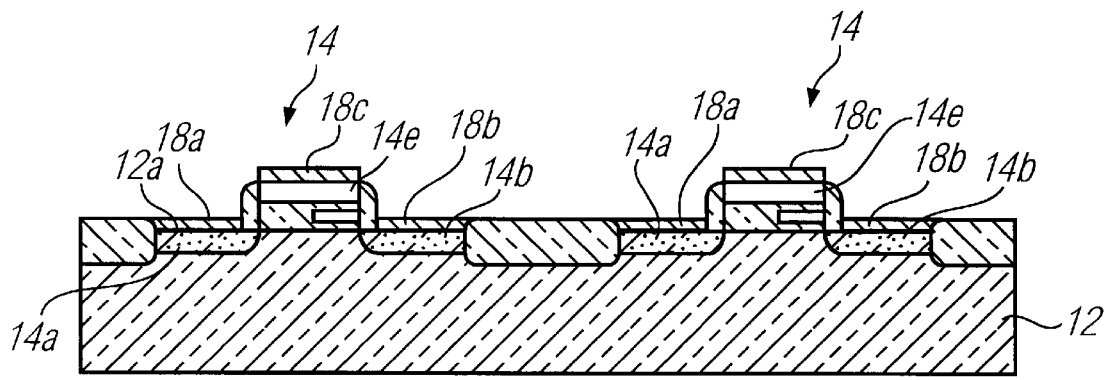

FIG. 2 shows how interconnect areas are formed for the elements of the cells using a silicide technique to increase the electrical conductivity. The process comprises forming a layer of a refractory metal silicide material such as tungsten, titanium, tantalum, molybdenum, etc. on the source, 14a, drain 14b, and control gate 14e to which ohmic contact is to be made, and then reacting the silicide material with the underlaying silicon material to form silicide source interconnect areas 18a, drain interconnect areas 18b, and control gate interconnect areas 18c respectively.

Figure 3:
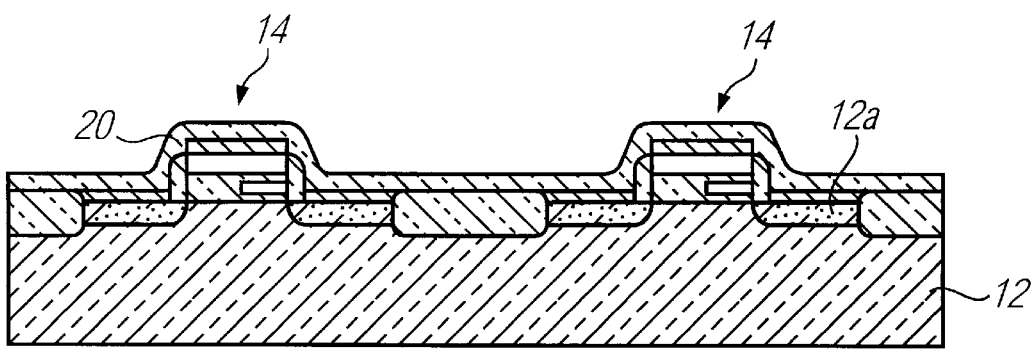

FIG. 3 illustrates how a silicon oxynitride (SiON:H) etch stop layer 20 is formed over the surface 12a of the substrate 12 and the devices 14 in accordance with the present invention. The "H" in the formula SiON:H indicates that the layer 20 includes a 30 residual amount of hydrogen. The etch stop layer 20 is preferably formed using Plasma Enhanced Chemical Vapor Deposition (PECVD) at a temperature of at least approximately 480° C. to a thickness of approximately 800±50 Å.

Basic Chemical Vapor Deposition (CVD) is a technique which normally requires a substrate temperature of at least 600° C. to achieve epitaxial deposition of a silicon oxynitride layer. PECVD improves on basic CVD by creating a glow discharge or plasma in the reaction chamber which enables a silicon oxynitride layer to be formed at a much lower temperature on the order of 350° C. to 400° C.

Conventional silicon oxynitride etch stop layers are typically formed at about 350° C.–400° C., and have high concentrations of hydrogen ions which migrate to the floating gates of EEPROM cells to recombine with electrons thereon and thereby dissipate charge. This causes poor data retention as discussed above.

The present step of forming the silicon oxynitride etch stop layer 20 at a higher temperature of at least approximately 480° C. results in a substantially lower concentration of hydrogen ions in the layer 20 than in a conventional silicon oxynitride etch stop layer which is formed at low temperature, thereby providing substantially improved data retention.

Figure 11:
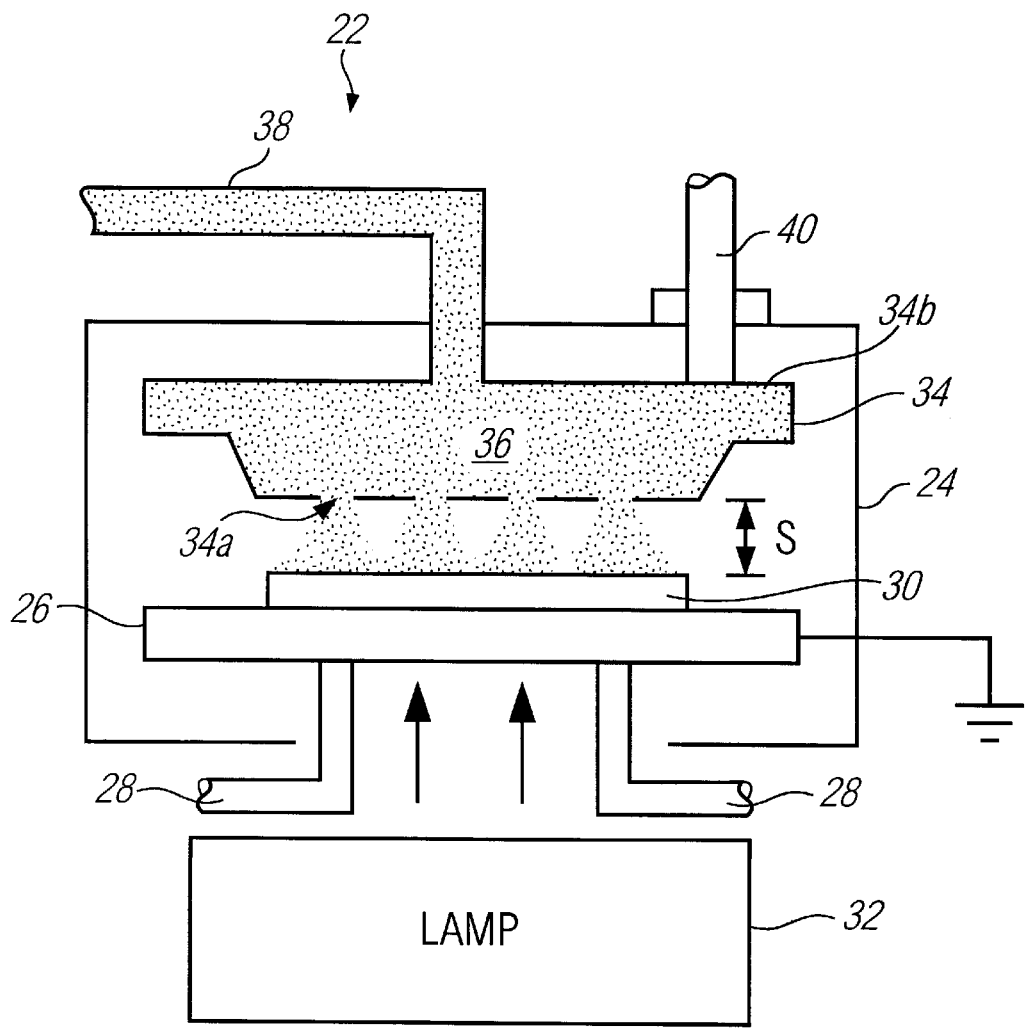
FIG. 11 is a simplified diagram illustrating a Plasma Enhanced Chemical Vapor Deposition (PECVD) apparatus for practicing the present invention.

A PECVD reaction chamber 22 for forming the silicon oxynitride layer 20 is illustrated in FIG. 11, and includes a container 24. Such a chamber 22 is commercially available from Applied Materials Corporation of Santa Clara, Calif., as model AMT5000. An electrically grounded susceptor 26 is suspended in the container 24. A silicon wafer 30 including one or more dies on which semiconductor structures such as the memories 10 as illustrated in FIG. 2 are formed is supported on the susceptor 26. Lift pins 28 are provided for placing the wafer 30 on the susceptor 26.

The wafer 30 is heated to a temperature of approximately 470° C. to 550° C., preferably 525° C., by a lamp 32. If necessary, the susceptor 26 can be replaced by a plasma chuck to attain a sufficiently high temperature in the particular reaction chamber being used.

A gas discharge nozzle which is known in the art as a shower head 34 is mounted in the container 24 above the wafer 30. A gas mixture 36 which is used to form the silicon oxynitride layer 20 is fed into the shower head 34 through an inlet conduit 38 and discharged downwardly toward the wafer 30 through orifices 34a. The gas 36 preferably includes silane ($SiH_4$), nitrous oxide ($N_2O$) and nitrogen ($N_2$).

Radio Frequency (RF) power is applied to the shower head 34 through a power lead 40. A blocker plate 34b is provided at the upper end of the shower head 34 to prevent gas from escaping upwardly.

The RF power applied to the shower head 34 creates an alternating electrical field between the shower head 34 and the grounded susceptor 26 which forms a glow or plasma discharge in the gas 36 therebetween. The plasma discharge enables the silicon oxynitride layer 20 to be formed at the temperature specified above.

The deposition temperature of at least approximately 480° C. produces a silicon oxynitride layer 20 with low hydrogen concentration. It is also desirable to maximize the wafer temperature prior to deposition. This produces a silicon oxynitride layer which is not porous or tensile.

The properties of the silicon oxynitride layer are further enhanced by making the layer silicon rich. This is accomplished by providing the gas 36 with a high concentration of silane relative to nitrogen, and performing the deposition at relatively low RF power.

Preferred values for these conditions are an $SiH_4$ flow rate of approximately 104±5 sccm, an RF power of approximately 345±10 watts, an $N_2O$ flow rate of approximately 41±2 sccm, an $N_2$ flow rate of approximately 600±10 sccm, a pressure of 3.5±0.2 torr, and a spacing S of approximately 360 mils (9.12 millimeters) between the shower head 34 and the surface of the wafer 30.

Figure 4:
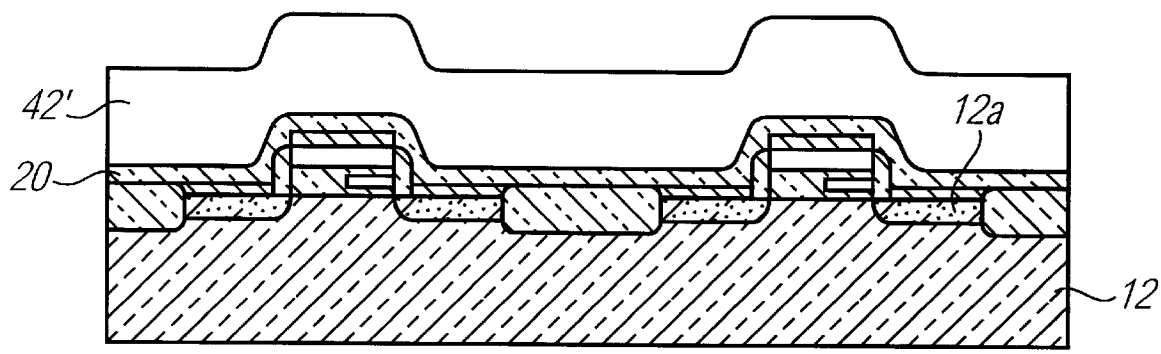
Figure 5:
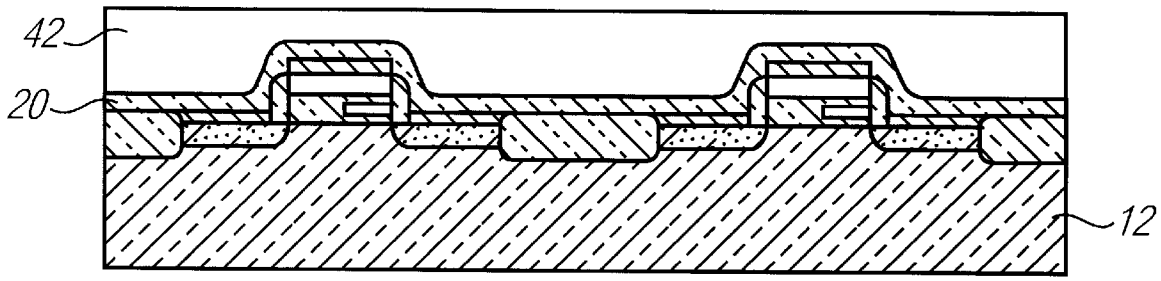

Referring now to FIG. 4, the next step of the process is to form an insulator layer 42', preferably of tetraethylorthosilicate (TEOS) glass, over the silicon oxynitride etch stop layer 20. The TEOS layer 42' is planarized as illustrated in FIG. 5 using, preferably, chemical-mechanical polishing, and redesignated as 42.

Figure 6:
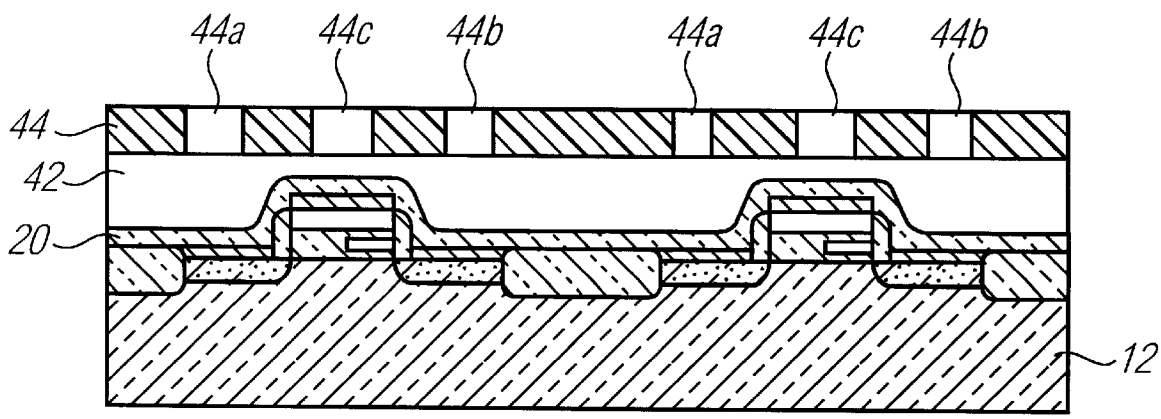

The remaining steps result in the formation of a tungsten damascene local interconnect structure for the memory 10. In FIG. 6, a layer of photoresist 44 is formed on the TEOS layer 42, and patterned using photolithography such that holes 44a, 44b and 44c are formed above the silicide interconnect areas 18a, 18b and 18c respectively.

Figure 7:
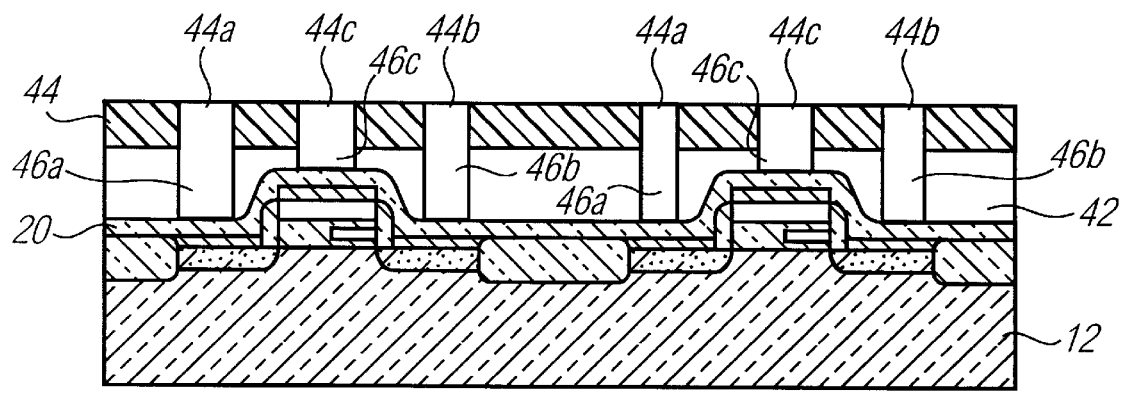
Figure 8:
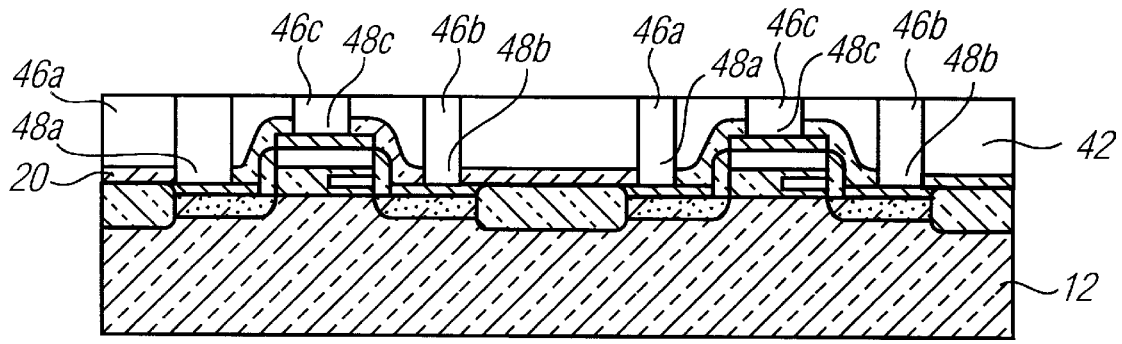

In FIGS. 7 and 8, holes are etched through the TEOS layer 42 and silicon oxynitride layer 20 down to the interconnect areas 18a, 18b and 18c, preferably using a two stage Reactive Ion Etching (RIE) process.

In FIG. 7, an RIE etch is performed using octafluorobutene ($C_4F_8$) which has a selectively high etch rate for TEOS and a low etch rate for silicon oxynitride. This results in the formation of vertical holes 46a, 46b and 46c which extend downwardly from the holes 44a, 44b and 44c of the photoresist layer 44 through the TEOS layer 42 and stop on the silicon oxynitride etch stop layer 20 in alignment with the interconnect areas 18a, 18b and 18c respectively.

In FIG. 8, the photoresist layer 44 is stripped away, and a second RIE etch is performed using fluoromethane ($CH_3F$), which has a selectively high etch rate for silicon oxynitride and a low etch rate for TEOS. This results in the formation of holes 48a, 48b and 48c through the silicon oxynitride layer 20. The holes 48a, 48b and 48c are extensions of the holes 46a, 46b and 46c through the TEOS layer 42, and terminate at the interconnect areas 18a, 18b and 18c respectively.

Figure 9:
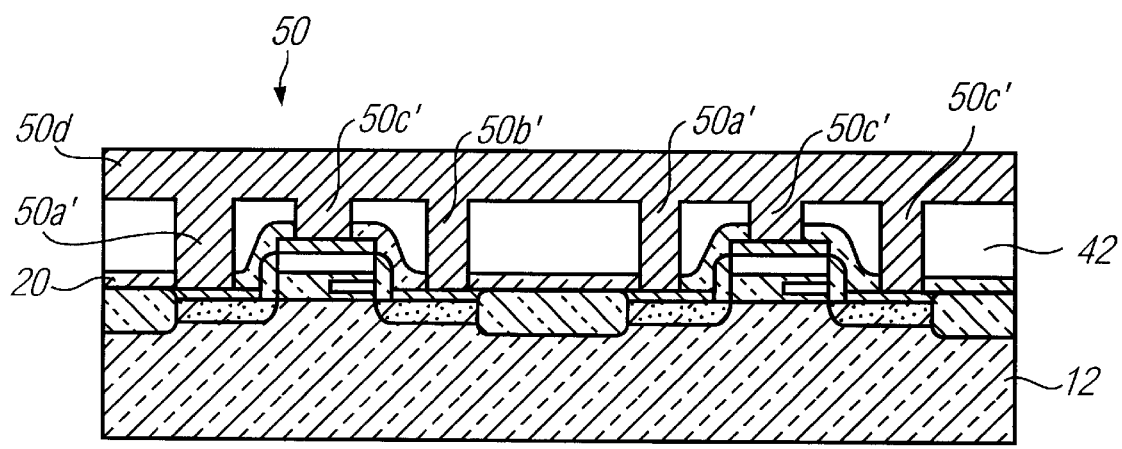

In FIG. 9, tungsten 50 is deposited over the structure of FIG. 8. The tungsten fills the holes through the TEOS layer 42 and the silicon oxynitride layer 20 as indicated at 50a', 50b' and 50c', and ohmically contacts the interconnect areas 18a, 18b and 18c respectively. The tungsten further forms on the top of the TEOS layer 42 as indicated at 50d.

Figure 10:
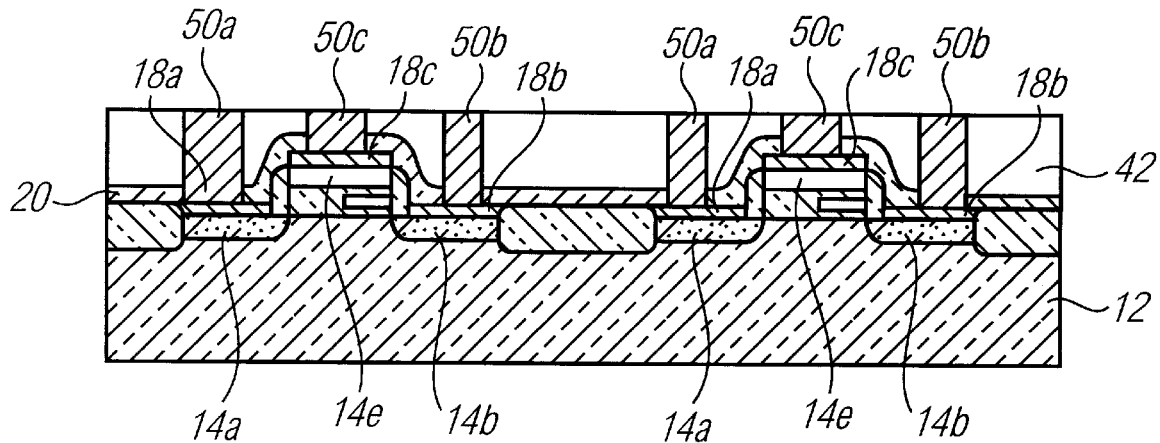

In FIG. 10, the top of the structure is planarized, preferably using chemical-mechanical polishing, to remove the tungsten 50d from the TEOS layer 42. The result is independent local interconnects 50a, 50b and 50c which are formed of tungsten inlaid in the TEOS layer 42 and the silicon oxynitride layer 20. The local interconnects 50a, 50b and 50c enable the sources 14a, drains 14b, and control gates 14e respectively of the transistors 14 to be electrically accessed from the upper surface of the structure.

In summary, the present invention overcomes the drawbacks of the prior art and provides a semiconductor structure including a silicon oxynitride layer etch stop layer with substantially improved data retention characteristics.

Various modifications will become possible for those skilled in the art after receiving the teachings of the present disclosure without departing from the scope thereof.

We claim:

1. A process for fabricating a semiconductor structure having a local interconnect, comprising the steps of:

(a) providing a semiconductor substrate;

(b) forming a semiconductor device having an interconnect area on a surface of the substrate;

(c) forming a silicon oxynitride etch stop layer over the surface of the substrate and the device at a temperature in the range of approximately 470° C. to 550° C.;

(d) forming an insulator layer over the etch stop layer;

(e) etching a first hole through the insulator layer to the etch stop layer in alignment with the interconnect area;

(f) etching a second hole through the etch stop layer to the interconnect area; and (g) filling the first and second holes with an electrically conductive material which ohmically contacts the interconnect area to form the local interconnect.

2. A process as in claim 1, in which step (e) comprises etching the first hole using Reactive Ion Etching (RIE) with octafluorobutene.

3. A process as in claim 1, in which step (f) comprises etching the second hole using Reactive Ion Etching (RIE) with fluoromethane.

4. A process as in claim 1, in which:

step (a) comprises providing the substrate of silicon; and step (b) comprises the substeps of:

(b1) forming a layer of a refractory metal silicide material over the interconnect area; and (b2) reacting the silicide material with underlying silicon to form the interconnect area as a silicide.

5. A process as in claim 1, in which step (g) comprises filling the first and second holes with tungsten to form the local interconnect as a tungsten damascene.

6. A process as in claim 1, in further comprising the step, performed between steps (d) and (e), of:

(h) planarizing the insulator layer using chemical mechanical polishing.

7. A process as in claim 1, in which step (d) comprises forming the insulator layer of tetraethylorthosilicate (TEOS) glass.

8. A process as in claim 1, in which step (c) comprises forming the etch stop layer at a temperature of approximately 525° C.

9. A process as in claim 1, in which:

step (c) comprises forming the etch stop layer using Plasma Enhanced Chemical Vapor Deposition (PECVD) with:

an $SiH_4$ flow rate of approximately 104±5 sccm; and an RF power of approximately 345±10 watts.

10. A process as in claim 9, in which step (c) further comprises forming the etch stop layer with an $N_2O$ flow rate of approximately 41±2 sccm, and an $N_2$ flow rate of approximately 600±10 sccm.

11. A process as in claim 9, in which step (c) further comprises forming the etch stop layer at a pressure of approximately 3.5±0.2 torr.

12. A process as in claim 9, in which step (c) further comprises forming the etch stop layer with a spacing between a PECVD shower head and the surface of the substrate of approximately 9.12 millimeters.

13. A process as in claim 1, in which step (c) comprises forming the etch stop layer to a thickness of approximately 800±50 Å.

14. A process for fabricating a semiconductor structure, comprising the steps of:

(a) providing a semiconductor substrate;

(b) forming a semiconductor device on a surface of the substrate; and (c) forming a silicon oxynitride layer over the surface of the substrate and the device at a temperature using Plasma Enhanced Chemical Vapor Deposition in the range of approximately 470° C. to 550° C.

15. A process as in claim 14, in which step (c) comprises forming the silicon oxynitride layer at a temperature of approximately 525° C.

16. A process as in claim 14, in which:

step (c) comprises forming the silicon oxynitride layer using Plasma Enhanced Chemical Vapor Deposition (PECVD) with:

an SiH$_4$ flow rate of approximately 104±5 sccm; and an RF power of approximately 345±10 watts.

17. A process as in claim 16, in which step (c) further comprises forming the silicon oxynitride layer with an N$_2$O flow rate of approximately 41 ± sccm, and an N$_2$ flow rate of approximately 600±10 sccm.

18. A process as in claim 16, in which step (c) further comprises forming the silicon oxynitride layer at a pressure of approximately 3.5±0.2 torr.

19. A process as in claim 16, in which step (c) further comprises forming the silicon oxynitride layer with a spacing between a PECVD shower head and the surface of the substrate of approximately 9.12 millimeters.

20. A process as in claim 14, in which step (c) comprises forming the silicon oxynitride layer to a thickness of approximately 800±50 Å.

* * * * *